United States Patent [19]
Hayes

[11] Patent Number: 5,432,697
[45] Date of Patent: Jul. 11, 1995

[54] TECHNIQUE FOR CONTROLLING THE SYMBOLIC DYNAMICS OF CHAOTIC SYSTEMS TO GENERATE DIGITAL COMMUNICATIONS WAVEFORMS

[75] Inventor: Scott T. Hayes, Silver Spring, Md.

[73] Assignee: The United States of America as represented by the Secretary of the Army, Washington, D.C.

[21] Appl. No.: 51,763

[22] Filed: Apr. 23, 1993

[51] Int. Cl.⁶ .................. G05B 13/02; H04L 9/04; H03B 29/00
[52] U.S. Cl. ........................... 364/158; 380/46; 331/78
[58] Field of Search .......... 364/158, 148; 380/46, 380/48; 331/78

[56] References Cited

U.S. PATENT DOCUMENTS 5,007,087  4/1991  Bernstein et al. .............. 380/46
5,245,660  9/1993  Pecora et al. ................. 380/48

OTHER PUBLICATIONS

Edward Ott, Celso Grebogi, and James A. Yorke, "Controlling Chaos," *The American Physical Society*, vol. 64, No. 11, pp. 1196–1199, Mar. 12, 1990.

Scott Hayes, Celso Grebogi and Edward Ott, "Information Transmission Using Chaos", Army Research Laboratory, Feb. 1993.

Peterson, Ivars, "Physical Science, Adding Chaos to Achieve Synchrony", *Science News*, Oct. 12, 1991, p. 239.

Pecors, L. & Carroll, T., "Driving Systems with Chaotic Signals", *Physical Review A*, vol. 44, No. 4, Aug. 15, 1991, pp. 2374–2383.

Crutchfield, J. P. et al., "Chaos", *Scientific American*, Dec. 1986, pp. 46–57.

Pecora, L. & Carroll, T., "Pseudoperiodic Driving: Eliminating Multiple Domains of Attraction using Chaos", *Physical Review Letters*, vol. 67, No. 8, Aug. 1991, pp. 945–948.

*Primary Examiner*—Paul P. Gordon
*Attorney, Agent, or Firm*—Freda L. Krosnick; Frank J. Dynda

[57] ABSTRACT

A method and apparatus for encoding information on a chaotic system by causing tiny perturbations in an accessible system control variable, or trajectory, uses the natural underlying symbolic dynamics of the system to encode the information. The system is allowed to behave chaotically even while tracking a pre-specified information-containing symbol sequence, thus maximizing the efficiency of information encoding and transmission.

15 Claims, 13 Drawing Sheets

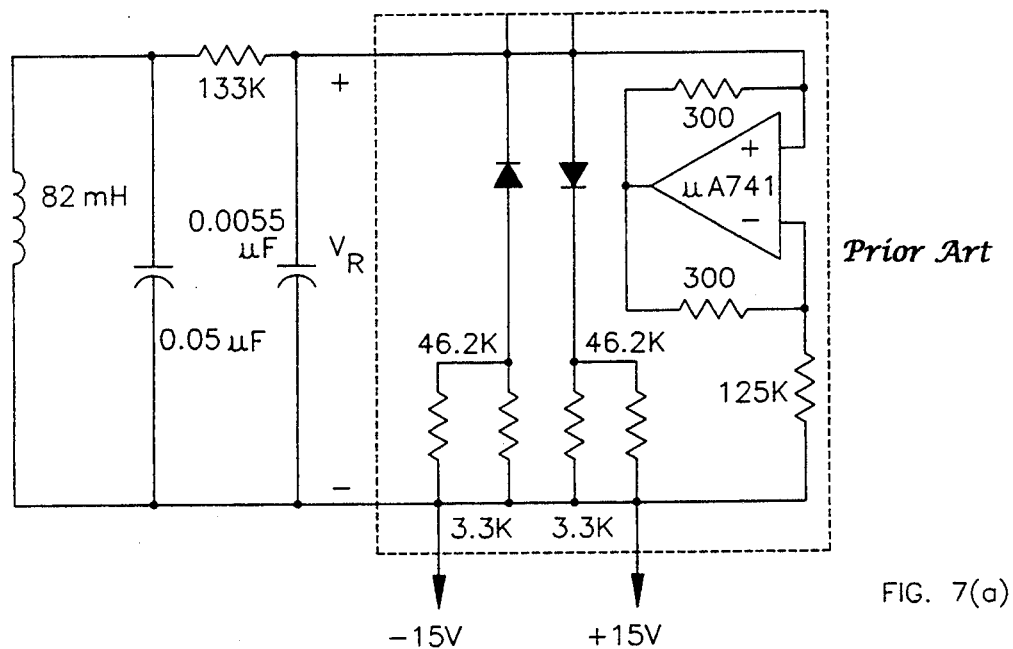
FIG. 7(a) *Prior Art*
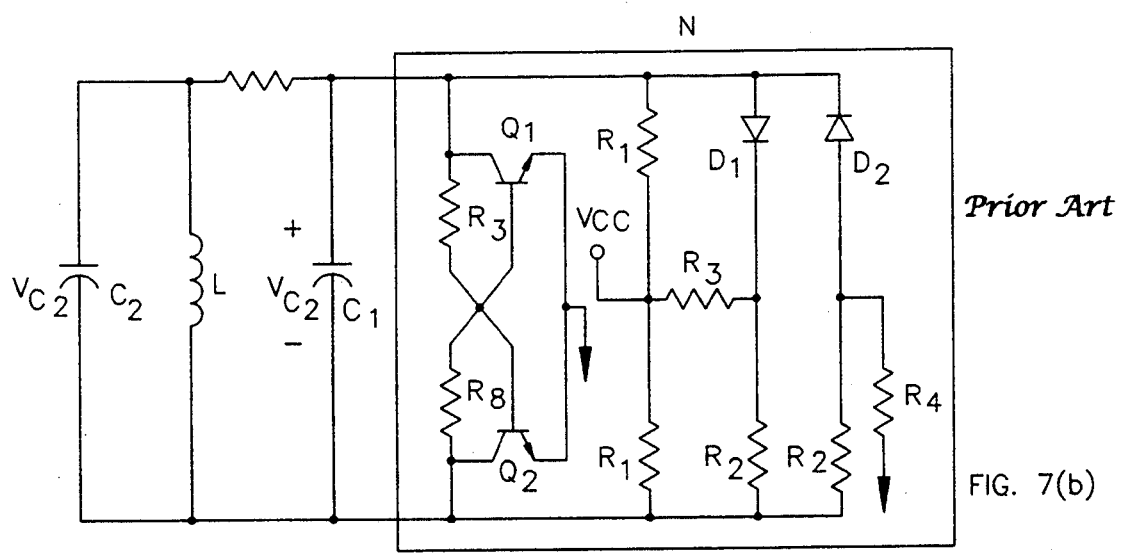
FIG. 7(b) *Prior Art*

TECHNIQUE FOR CONTROLLING THE SYMBOLIC DYNAMICS OF CHAOTIC SYSTEMS TO GENERATE DIGITAL COMMUNICATIONS WAVEFORMS

BACKGROUND OF THE INVENTION

1. Field of the Invention

This invention relates to a method and apparatus for using the natural symbolic dynamics of a chaotic signal to carry information.

2. Description of Related Art

No other method or apparatus for using the natural complexity of chaos to carry information is known. Although a technique for controlling periodic orbits of chaotic systems using small perturbations has been proposed by Ott, Grebogi, and Yorke of the University of Maryland (Phys. Rev. Letters 12 March 1990), the purpose of the technique is to generate periodic waveforms. In contrast, the present invention proposes to send information via a chaotic signal without significantly altering the dynamics of the chaotic information carrier.

Transmission of information has heretofore always been accomplished by modulating the waveform of a simple carrier, usually a sinusoid. The present invention generates an information bearing waveform by controlling the symbolic dynamics of a chaotic system using microscopic control perturbation; thus the trajectory approximates a possible natural trajectory of the system.

SUMMARY OF THE INVENTION

In its most general form, the invention is a method and apparatus for utilizing a small perturbation control to embed information in a chaotic oscillation, possibly without affecting the symbol statistics of the oscillation. The controls affect only the sequence of symbols, and the waveform is otherwise indistinguishable from an unmodulated one. It is possible, and may be desirable in some case, to affect the symbol statistics to increase the information rate of a given oscillator.

A characteristic of a chaotic system is that while the equations which describe the dynamics of the system, like the Newtonian equations for particle motion, may be very simple deterministic, albeit nonlinear, sets of equations, solutions to the equations are highly disordered and may appear to be random. If one does not know the equations of motion, then the chaotic signals may be indistinguishable from random processes or noise, even though the chaotic signals are actually self-oscillatory and not driven by noise. The apparent randomness of the solutions results from their very high sensitivity to small fluctuations or variations in initial conditions.

It has long been recognized that a communication signal of high quality has properties which are similar to a noise process, and that such signals may be modeled as random processes. An information signal is considered to be of high quality if no symbol or information unit is redundant and if none depend on other symbols or information units for meaning. In ordinary language, the meaning of a symbol depends on context, for example, context, the order of letters in a word and the grammatical structure of a sentence, resulting in a less than optimum signal quality. In a random process, each fluctuation is a new and useful piece of information which does not repeat or depend for meaning on the old piece of information.

On the other hand, the information content of a truly random process cannot be controlled, and thus all prior information transmission, techniques have relied on periodic processes which can easily be controlled to impress information on the signal. One advantage of a chaotic signal is that while it is very complex, it has a structure which can be manipulated without changing the basic chaotic character of the signal in order to assign symbols in a desired sequence.

A measure of the randomness of an information sequence is its Shannon entropy. The invention has the property that the Shannon entropy of the symbols generated thereby need not change from the natural Shannon entropy of the symbols generated by a "free-running" chaotic oscillator, and thus information quality is maximized.

In a chaotic dynamical system, partitioning the state space into separate regions and listing a symbol associated with each region as the system operates will yield a symbol sequence. If this state space partition is optimal (called generating in the literature), the Shannon entropy of the symbol sequence will be equal to the so-called Kolmogorov or metric entropy of the dynamical system. By controlling the system using the inventive technique, one can cause the system to achieve an information rate given by the so-called topological entropy of the dynamical system. Thus, while the Shannon and Kolmogorov entropy give the actual information rates with an optimal partition when the system is operating according to a given dynamics, the topological entropy gives the channel capacity with the chaotic system viewed as an information channel.

Using the idea of controlling chaos using small perturbations, proposed by Ott Grebogi, and Yorke, adapted for purposes of the invention, a chaotic system is controlled without any fundamental alterations by utilizing the property of sensitivity to small fluctuations in initial conditions or in a system parameter. It therefore can be implemented by means of a small signal system that does not require the power generating system to be stabilized. As a result, by way of example, a large microwave power source could be modulated utilizing small low-power integrated circuits.

Since electrical oscillators tend to go non-linear at high power levels (such as are generated by microwave power BWOs and Magnetrons, and also lasers), the oscillators tend to become chaotic, making them useless for standard modulation. The inventive technique makes these efficient high-power systems very useful by using their basic chaotic nature to generate a high quality information signal possessing desired characteristics. Since the signals are generated by deterministic differential or mapping equations, it is also possible to filter interfering noise from the signals using so-called dynamical smoothing filters that are matched to the dynamics of the system, and therefore achieve extremely good information rates through noisy channels.

In an especially preferred embodiment of the invention, a local linear state-space map is used to predict the deviation of a passing nearby trajectory from a desired one after one or more iterates. This information is used to generate a control parameter and thus capture the wandering trajectory.

BRIEF DESCRIPTION OF THE DRAWINGS

FIG. 7(a) is a schematic diagram of a Chua's circuit for producing a Lorenz-like attractor.

FIG. 7(b) is a schematic circuit diagram of a Chua's circuit for discrete transistors.

DETAILED DESCRIPTION OF THE PREFERRED EMBODIMENTS

Figure 1A:
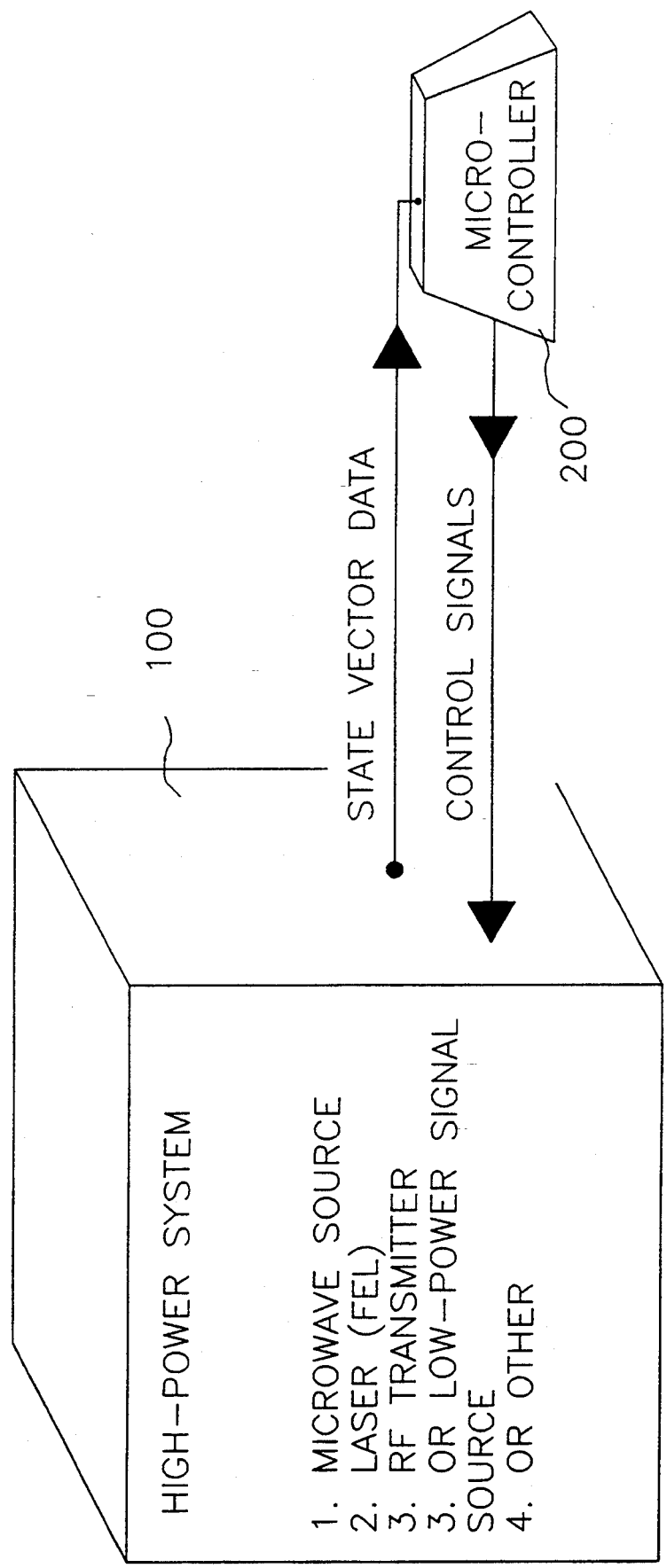
FIG. 1(a) is a block diagram showing the invention in its most general form.
Figure 1B:
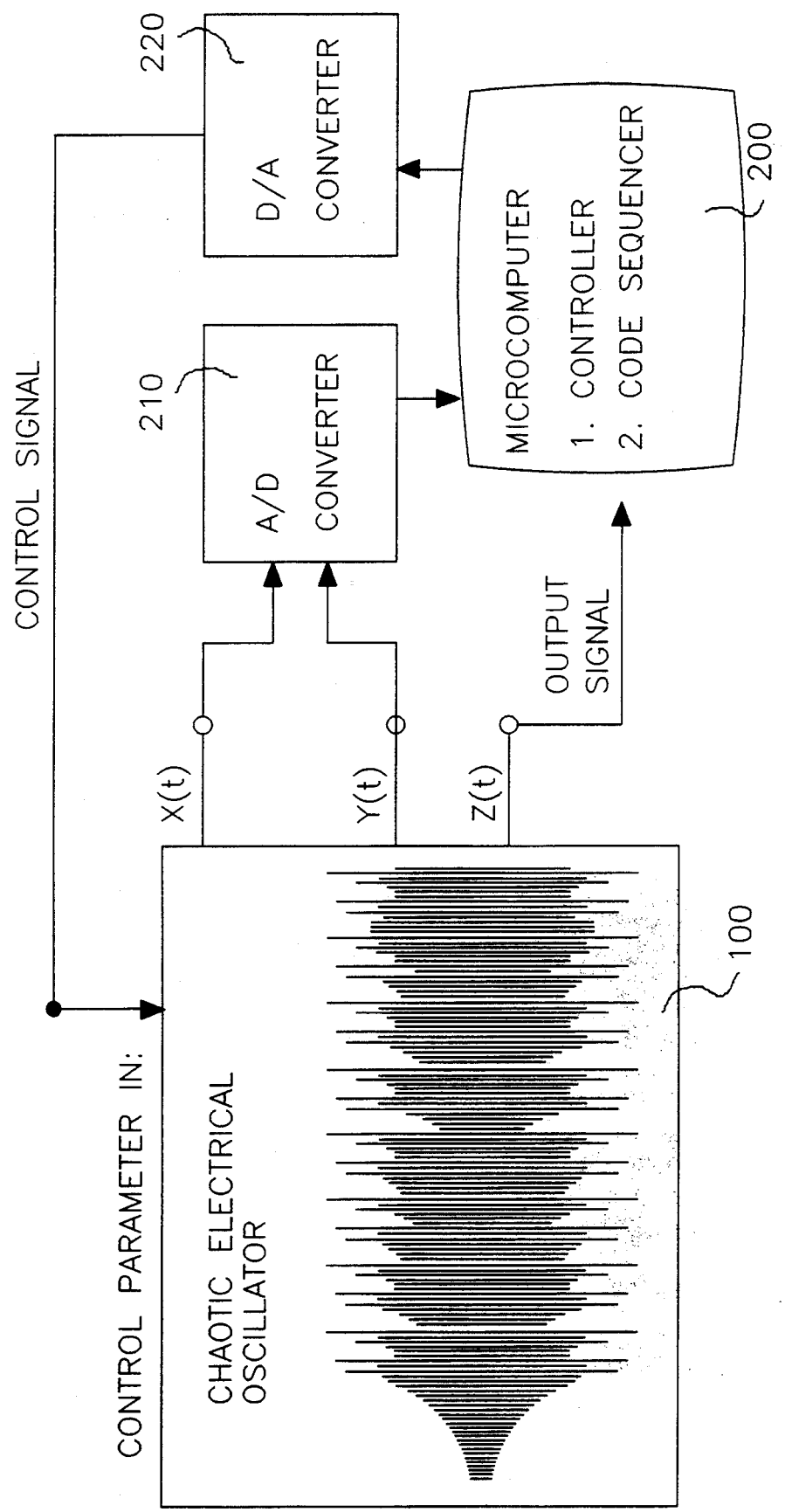
FIG. 1(b) is a version of the system of FIG. 1(a) for a signal having three-dimensional state vectors.

FIG. 1(a) illustrates the relationship between the signal source to which the invention is applied and the controller which implements the invention. The signal source represented by block 100 can be any chaotic signal source, including but not limited to high power sources of the types listed in block 100. The controller itself, on the other hand, requires relatively little power and is represented in FIG. 1(a) by micro-controller 200. Modulation is carried out by reading state vector data for the power source and supplying control signals to vary an input parameter of the source. FIG. 1(b) illustrates an application of the system of FIG. 1(a) for a three-dimensional chaotic oscillator with a digital controller including A/D and D/A converters 210 and 220.

The invention is in general applicable to any non-linear system with chaotic properties. A particularly suitable system for demonstration purposes because its properties are especially well-known is that of the Lorenz attractor, but numerous other chaotic systems are known to which the principles of the invention can be applied.

The Lorenz attractor is the attractor of a three-dimensional dynamic system in which the state of the system at any point can be described by the following equations:

$$\dot{x} = -\sigma x + \sigma y \quad \sigma = 10 + \delta \quad (1)$$

$$\dot{y} = rx - y - xz \quad r = 28 \quad (2)$$

$$\dot{z} = -bz + xy \quad b = 8/3 \quad (3)$$

Figure 2:
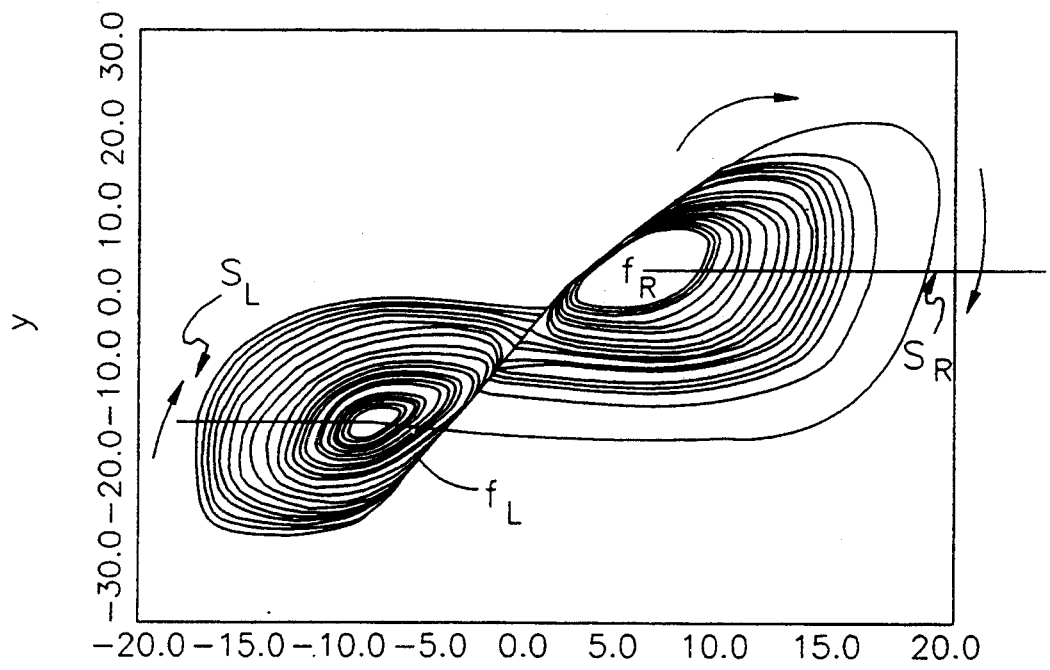
FIG. 2 is a phase space plot of a Lorenz attractor.

A characteristic of the Lorenz system is that iterative solutions of the phase space coordinates x, y, and z follow the path or trajectory whose projection in the xy plane is shown in FIG. 2. The trajectory is always slightly different, and yet forms a substantially figure-eight shaped structure known as an attractor. The attractor may be analyzed by plotting the trajectory at intervals along a cross-section of the attractor known as a Poincare Surface-of-Section (PSS), illustrated in FIG. 5. For the Lorenz attractor, two sections may be taken, designated $S_L$ for the left section and $S_R$ for the right section as shown in FIG. 2, each section being taken through the coordinates of the focii of the attractor.

By varying $\delta$ to change the parameter $\sigma$, the divergence of the orbits about the focii is changed without changing the fundamental behavior of the system, with the result that the points on the PSS will be moved upward or downward. The idea is to control this divergence by choosing $\delta$ so that the trajectories will fall into designated areas, referred to hereinafter as code sequence windows, with each window corresponding to a future information symbol sequence.

Figure 3A:
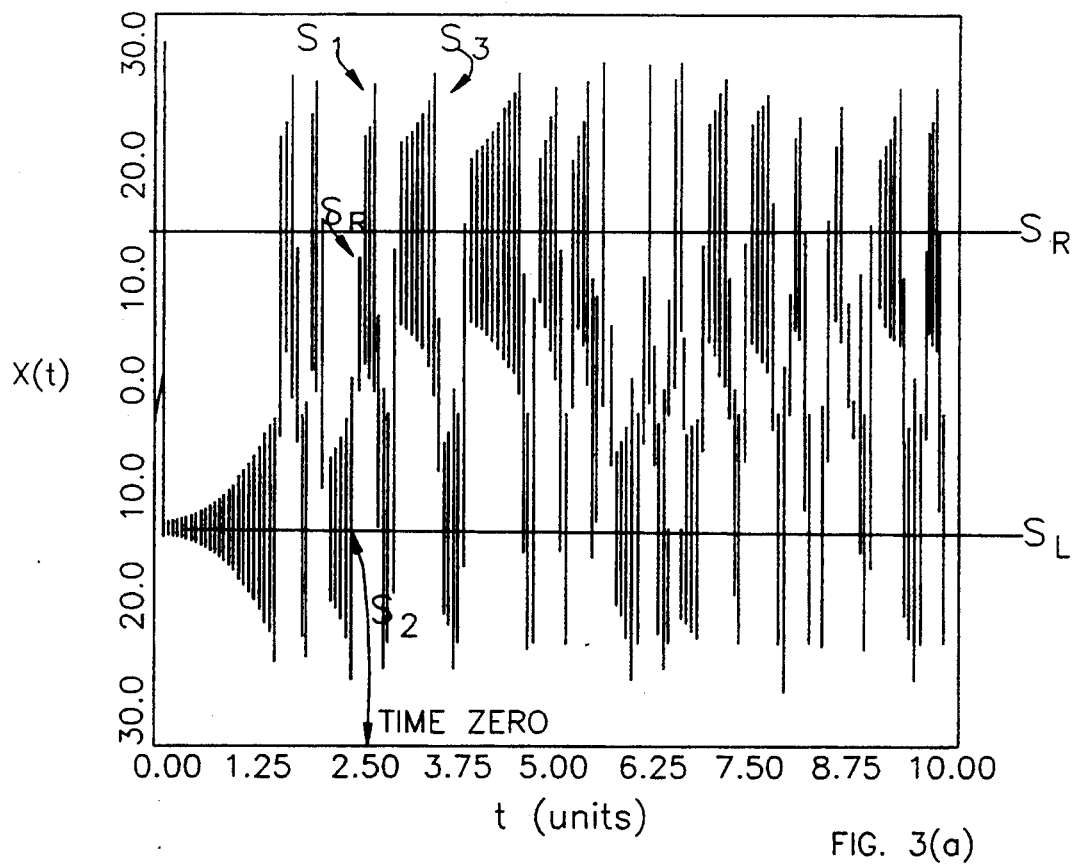
FIG. 3(a) is a graph showing the Lorenz signal for the attractor of FIG. 1 in times series form.
Figure 3B:
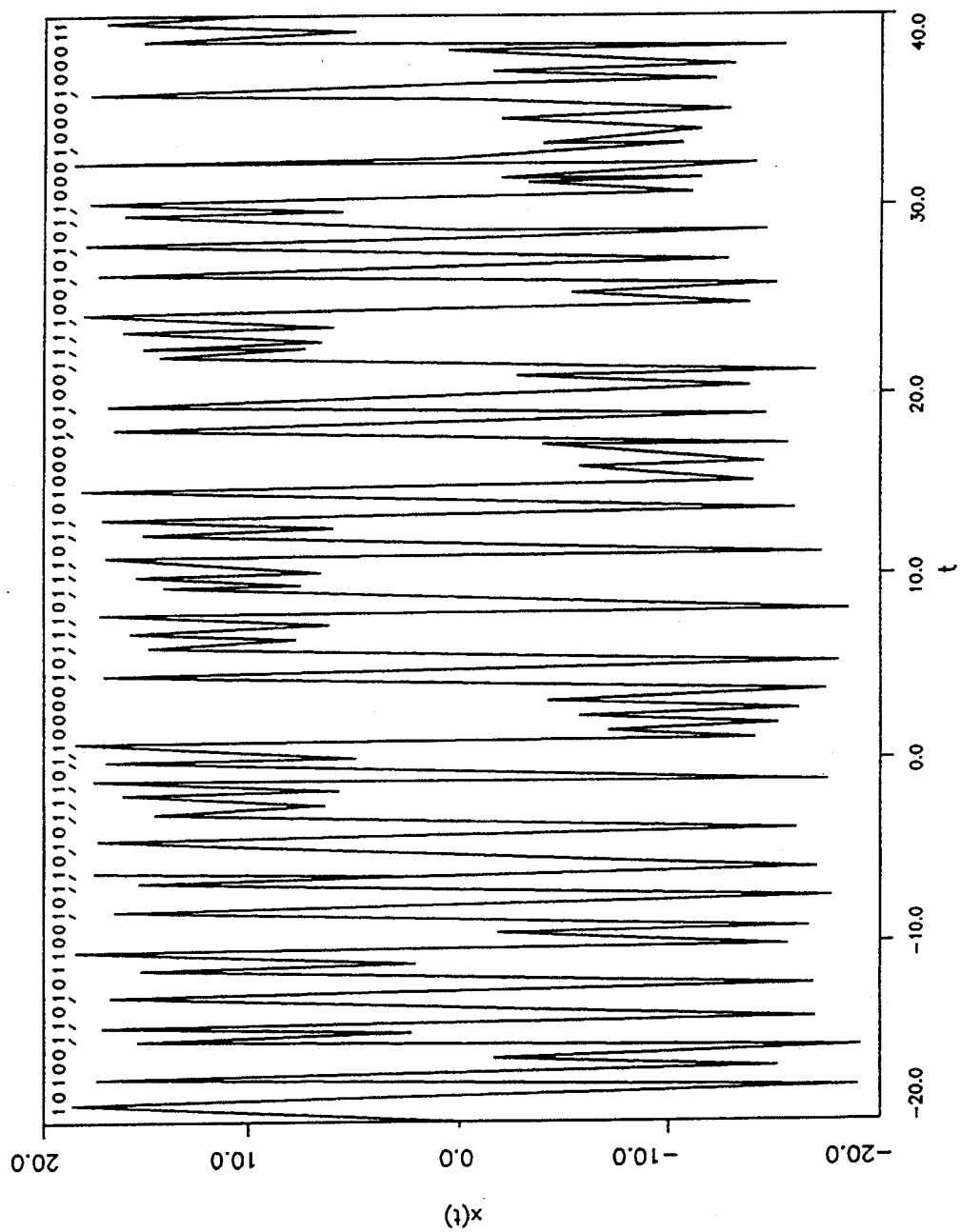
FIG. 3(b) is a graph showing a Lorenz signal with binary code windows.

The x variable plotted as a function of time is illustrated in FIGS. 3(a) and 3(b). The signal tends to oscillate a number of times around the two values which correspond to the focii of the attractor. The upper oscillations correspond to orbits around the right focus through $S_R$ while the lower oscillations trace orbits around the left focus through $S_L$. Meaning is assigned to the orbits in the form of the number of times an orbit crosses a respective PSS before changing to the other. In the example shown in FIG. 3(a), taking time zero at the $S_L$ crossing, the trajectory crosses $S_R$ three times, and thus the first symbol is the number three. The trajectory crosses $S_L$ once, and thus the second symbol is one, and then crosses $S_R$ four times, so that third symbol is four, and so forth. In the example shown in FIG. 3(b), the upper and lower oscillations correspond to binary digits 1 and 0.

Figure 4A:
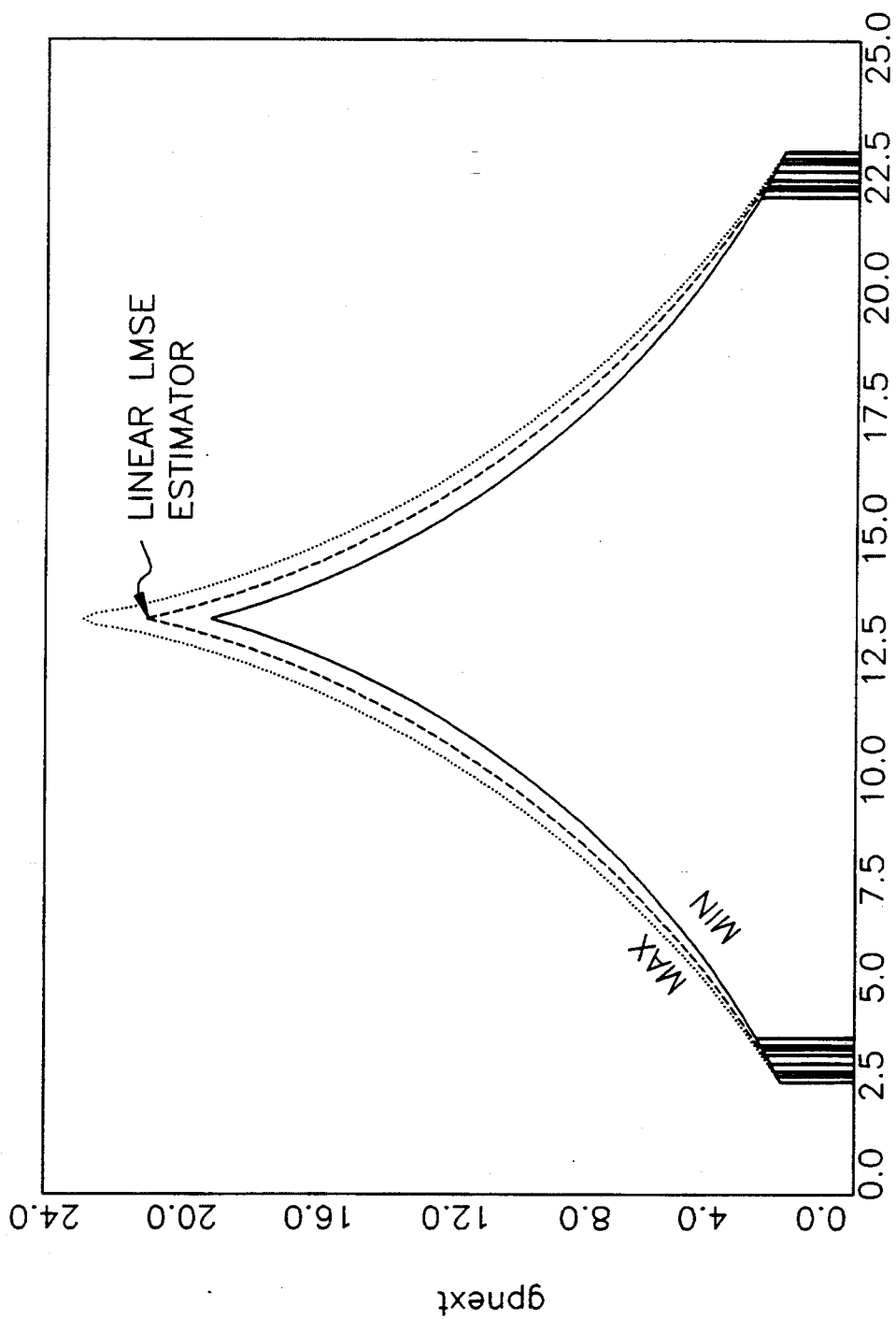
FIG. 4(a) is a return map for the attractor of FIG. 1.
Figure 4B:
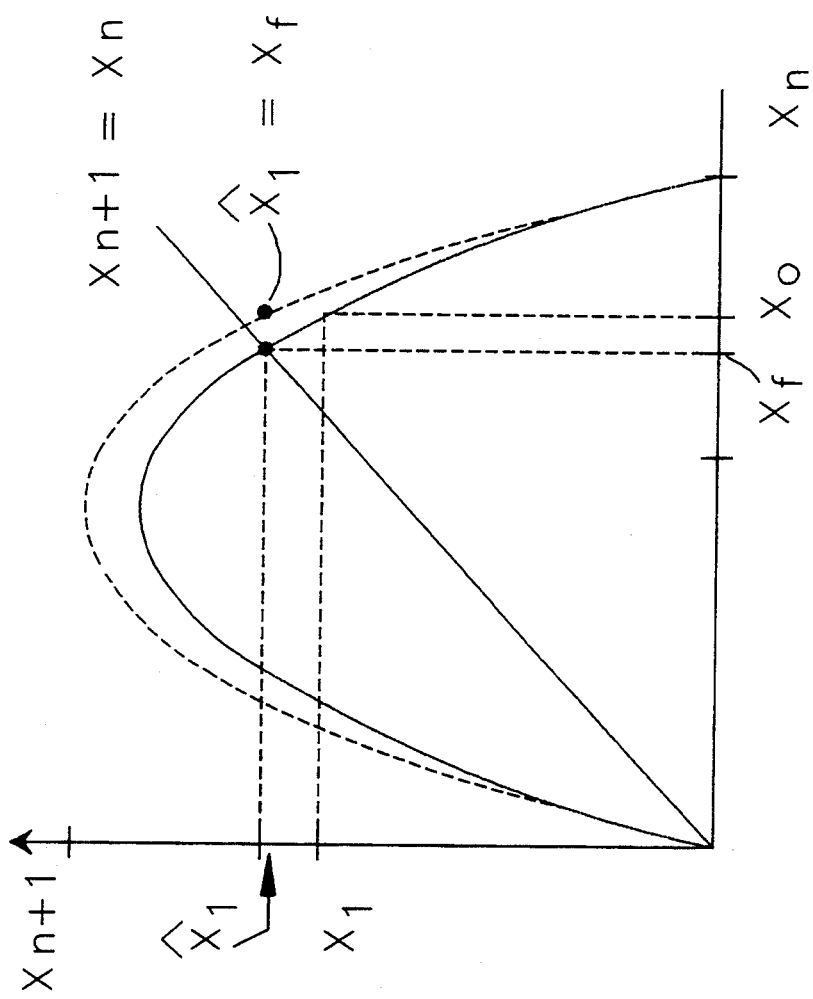
FIG. 4(b) is a one-dimensional state-space map illustrating a perturbation technique according to a preferred embodiment of the invention.

The return map illustrated in FIG. 4(b) is used to predict the trajectory starting at a particular value of x and iterating it by plotting $x(n+1)$ versus $x(n)$. The variable $x(n+1)$ represents the point at which the trajectory crosses the PSS after one orbit, $x_n$ being the previous intersection. The closer $x(n+1)$ is to $x(n)$, the more stable the orbit. As shown in FIG. 4(b), a code sequence window is constructed around a point $X_F$ on a portion of the PSS which has the desired properties, and $\delta$ is chosen to shift the signal into the appropriate window based on the predicted trajectory. This is accomplished by finding the difference $x_o - x_f$ between the point $x_f$ on the desired trajectory which intersects the line $x_n = x_{n+1}$ and the point $x_o$ where $x_n = x_{n+1}$ crosses the actual trajectory, as suggested by FIG. 4(b), which is a return map for a one-dimensional orbit. Since $$x^{(1)} = f^{(1)}(x_0, p_0) \quad (4)$$

$$\delta x^{(1)} = \frac{\partial f^{(1)}}{\partial p}\bigg|_{(x_0, p_0)} \cdot \delta P \quad (5)$$

which tells how much the parameter p, and in this case control signal $\delta$, must be varied in order to obtain a desired trajectory.

Figure 5:
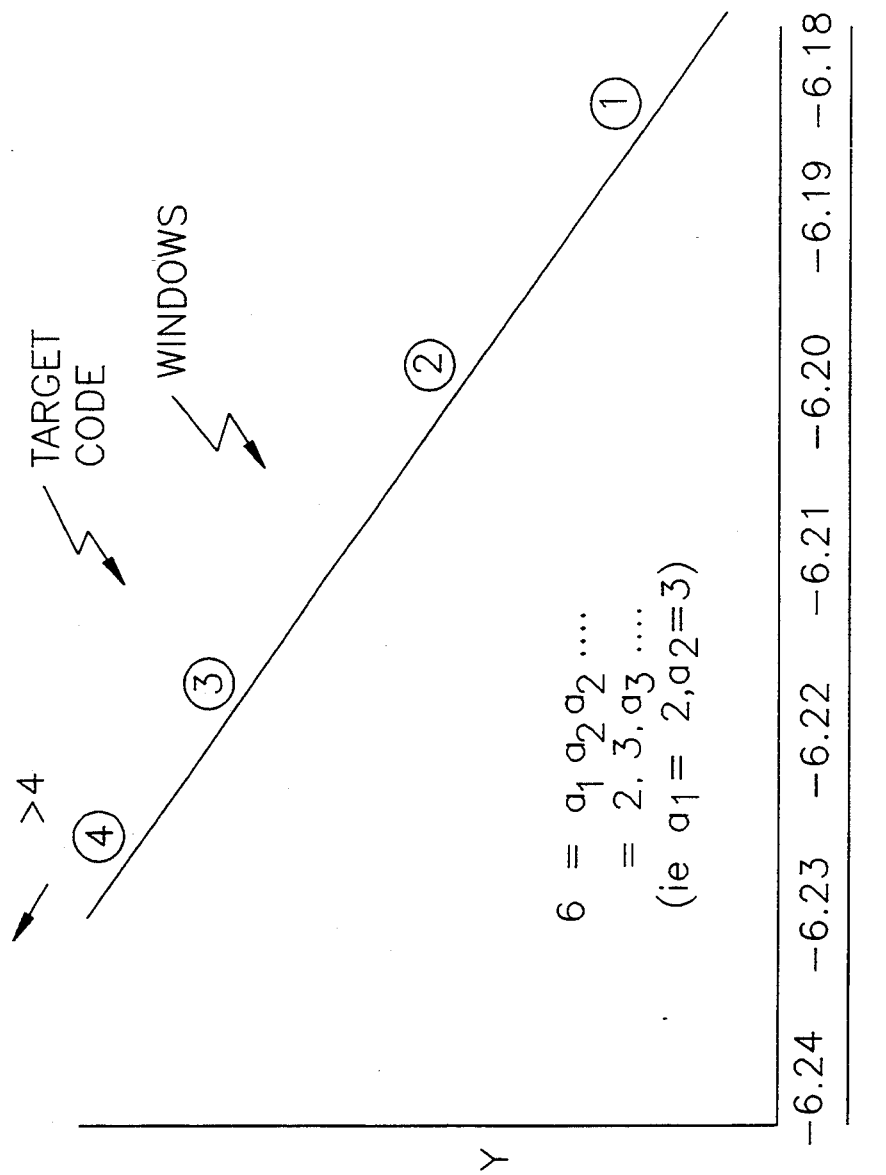
FIG. 5 is a Poincare Surface-of-Section with code sequence windows for the attractor of FIG. 1.

The portion of the PSS shown in FIG. 5 represents a sequence in which the first two symbols are 2 and 3, with different next ones ($\zeta = 2.3.S_3 \ldots$.) The PSS is a fractal structure, and thus the windows can be reduced in size until they become smaller than the noise variant, after which the windows become unobservable and untargetable.

If the target is equal to $S_1, S_2, S_3, S_4, S_5 \ldots$, the sum of the symbols must be roughly less than or equal to some value determined by the following formula:

$$\zeta = S_1 S_2 S_3 S_4 S_5 \ldots \sum_i S_i \leq \text{(some value)} \quad (6)$$

where (some value) is determined by $$\sum_i S_i \approx \frac{1}{.7\lambda} \ln \frac{W}{\delta x} \quad (7)$$

and where $\delta x$ is the smallest window size, 0.7 is the time for one Lorenz cycle in units, and $\lambda$ is the Liapunov Exponent. Iteration through the different windows generates a different finite length sequence $\zeta = S_1, S_2, S_3, S_4, S_5 \ldots S_N$, with control being achieved by varying $\delta$ to shift the window positions so that the trajectory goes through the right one, as explained above.

Figure 6A:
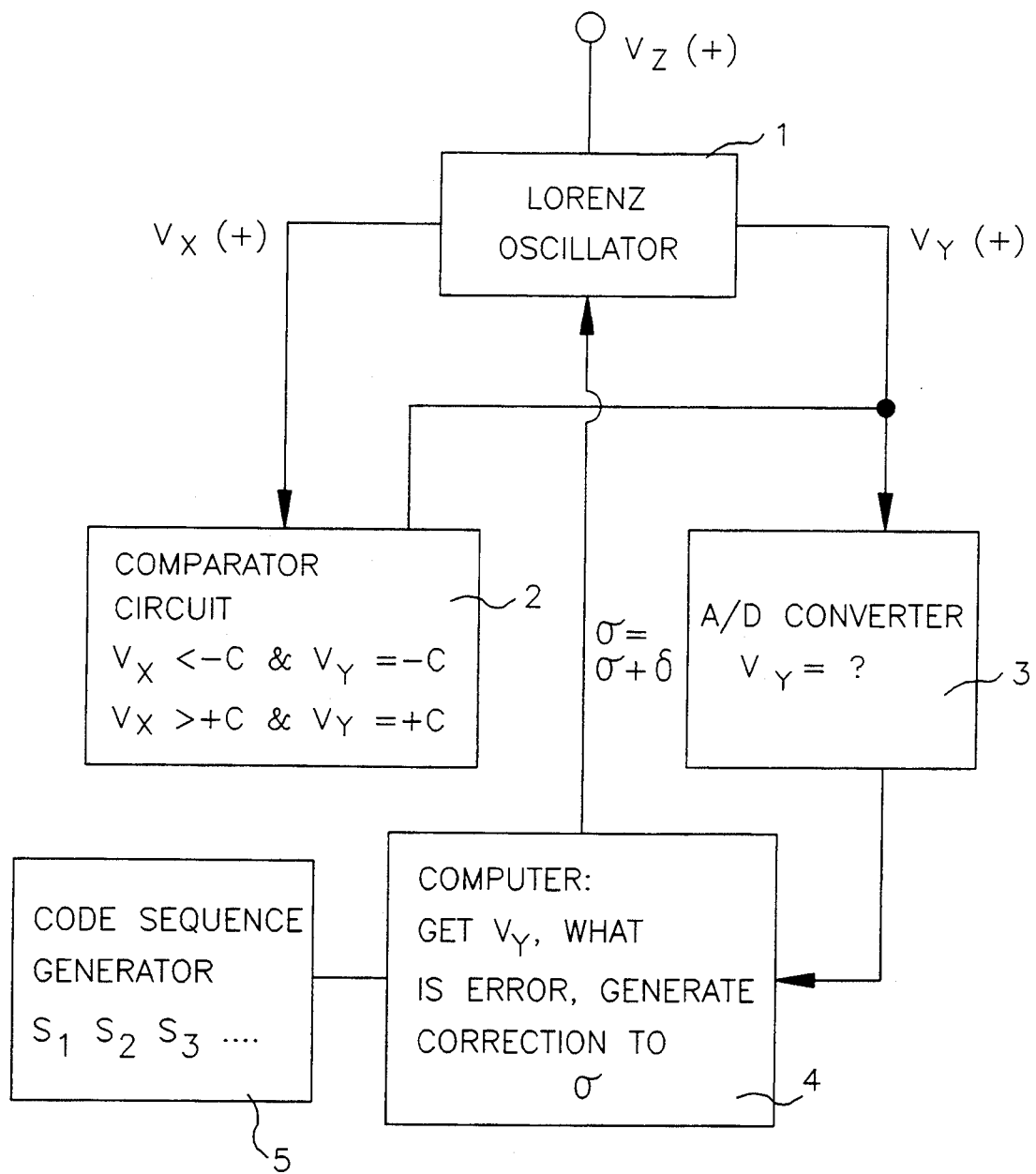
FIG. 6(a) is a block diagram of a code sequence generator utilizing a Lorenz oscillator in accordance with the principles of a preferred embodiment of the invention.

A block diagram of a system for implementing the above is shown in FIG. 6(a). Lorenz oscillator 1 generates voltage signals corresponding to the three Lorenz equation variables x, y, and z. The x voltages are monitored by comparator circuit 2 to determine the current PSS (the respective focii for $S_L$ and $S_R$ are (—C, —C) and (C, C)), while the y value represented by $V_y$ is digitized by A/D converter 3 and used to initiate the calculation of $\delta$ based on the desired code sequence input via code sequence generator 5. Computer 4 digitally solves for $\delta$ based on the direction of a target value of $V_X$ determined from the PSS for the current value of $\sigma$.

Thus, by monitoring $V_y$ and the $V_x$, the illustrated circuit finds the values of x at which the three-dimensional signal crosses the PSS (L or R). The control signal is perturbed periodically by varying $\delta$ to keep the trajectory going through the proper code sequence windows, always staying ahead of the desired code sequence by enough that the perturbations are on the order of the noise present.

Figure 6B:
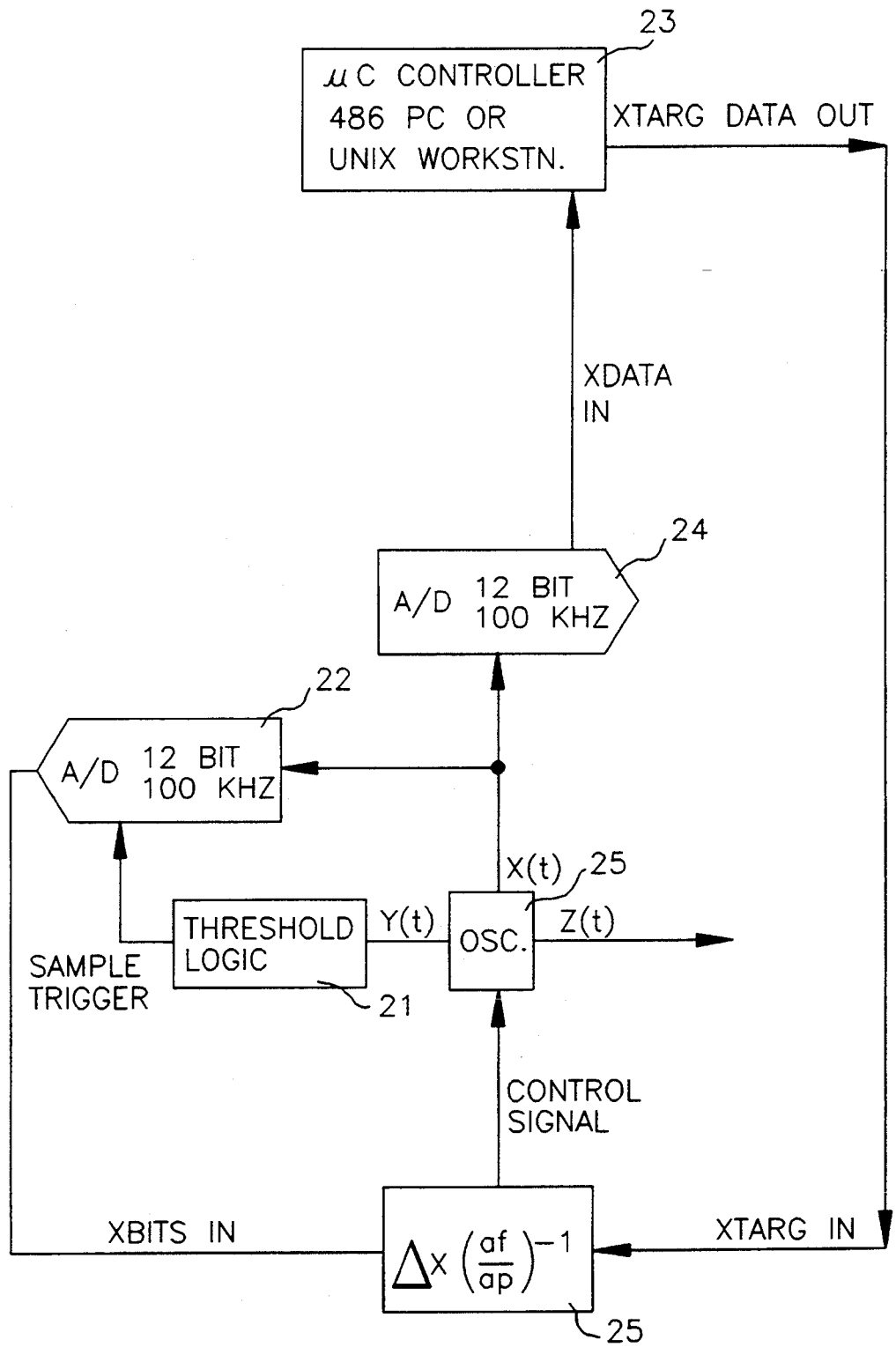
FIG. 6(b) is a block diagram showing a variation of the circuit of FIG. 6(a).

Another preferred digital version of a circuit for practicing the invention, shown in FIG. 6(b), includes an oscillator 20, and a threshold logic circuit 21. Circuit 21 reads y(t) and causes binary samples to be taken of x(t) via digitizer 22 at intervals corresponding to the PSS, and which digitally calculates x target data and generates a control signal based on the variation between the x target data calculated by computer 23, preferring a Unix workstation or 486PC, based on x bits sampled and digitized by digitizer 24 on the PSS using a subtract and multiply D/A circuit 25. Circuit 25 calculates the change in a control parameter p relative to x about an initial point to obtain the target trajectory which will result from the change in p as illustrated in FIG. 4(b).

A circuit which provides an attractor analogous to the Lorenz oscillator is Chua's circuit, shown in two implementations in FIGS. 7(a) and 7(b). The attractor generated by Chua's circuit possesses a Lorenz topology in the sense of a one-dimensional return map. By using the difference signal between the modulating waveform and the PSS $x_p$ value, the parameter modulations for the Chua's circuit can be provided in analog form.

The Chua circuit is described by the following three equations $$\dot{V}_{c1} = \frac{1}{RC_1}(V_{c2} - V_{c1}) - \frac{g(V_{c1})}{C_1} \quad (8)$$

$$\dot{V}_{c2} = \frac{1}{RC_2}(V_{c1} - V_{c2}) + \frac{i_L}{C_2} \quad (9)$$

$$\dot{i}_l = -\frac{1}{L} V_{c2} \quad (10)$$

setting $$\dot{x} = \dot{V}_{c1}, \dot{y} = \dot{V}_{c2}, \text{ and } \dot{z} = \dot{i}_L \quad (11)$$

the following set of equations for the Chua's attractor is obtained:

$$\dot{x} = -\frac{1}{L} z \quad (12)$$

$$\dot{y} = -\frac{1}{RC_1}(y + z) - \frac{1}{C_1} g(y) \quad (13)$$

$$\dot{z} = -\frac{1}{RC_2}(y + z) + \frac{1}{C_2} x \quad (14)$$

Figure 8:
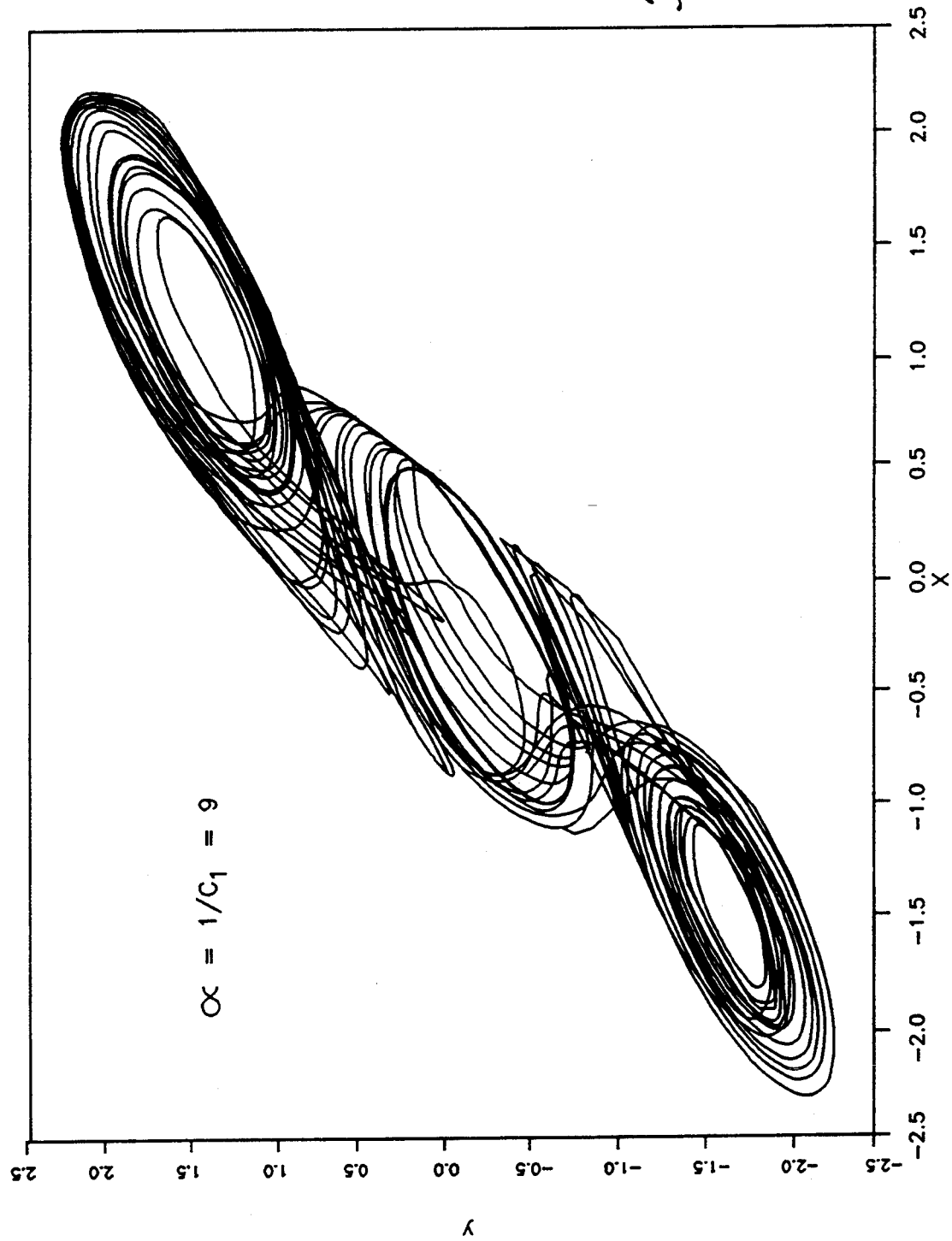
FIG. 8 is a phase space plot of an attractor generated by the circuits of FIGS. 7(a) and 7(b).
Figure 9:
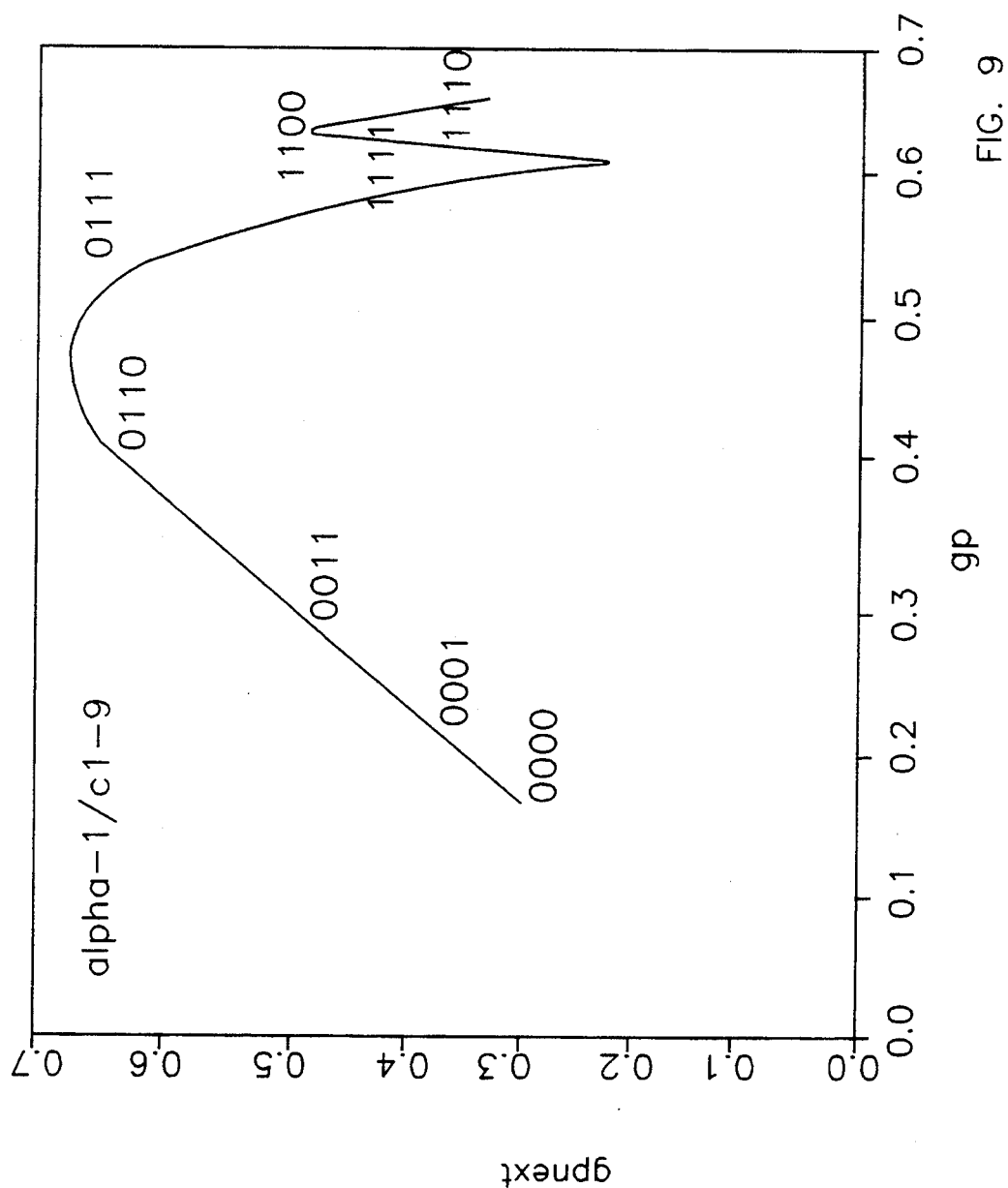
FIG. 9 is a return map for a Lorenz attractor corresponding to the attractor of FIG. 8 with generalized PSS coordinate gp.

The resulting attractor is illustrated in FIG. 8 and a return map with binary code windows is shown in FIG. 9. In the return map of FIG. 9, $g_p$ is a generalized coordinate along the PSS which allows direct mappings of a target code $d_c$ onto $\delta_p$ based on the substitution $$\delta p = \left(\frac{\partial f}{\partial p}\right)^{-1}_{x_0,p_0} \delta x = \left(\frac{\partial f}{\partial p}\right)^{-1}(g_p^{+1} - \hat{g}_p^{+1}). \quad (15)$$

Figure 10:
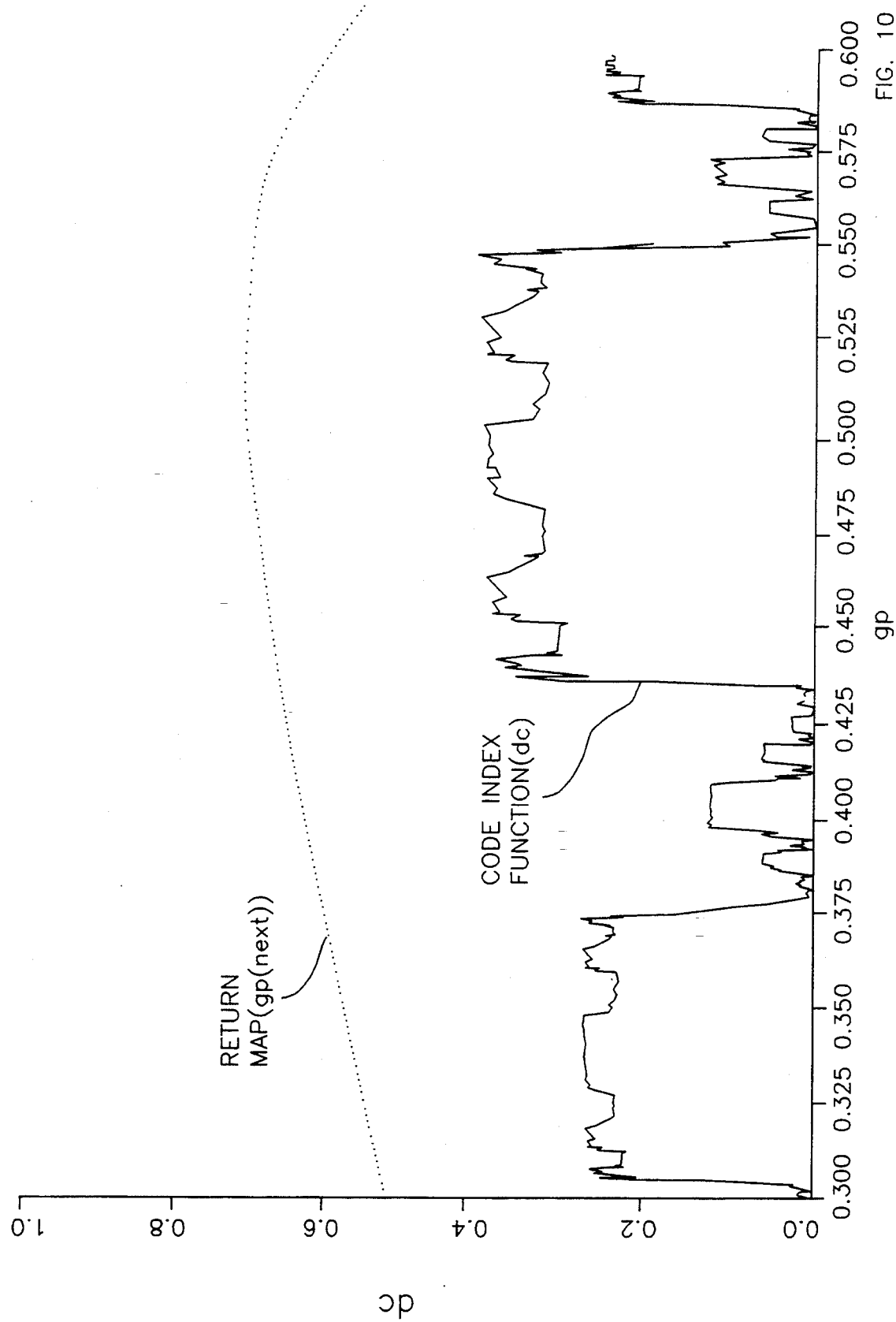
FIG. 10 is a section of the return map of FIG. 9 with a superimposed code index function.

The relationship between a target code $d_c (b_n b_{n+1} b_{n+z} \ldots)$ and $g_p$ is $g_p = g_p(dc)$, i.e., the target coordinate on the PSS is some function of the input and the incoming code depending on the code windows. Substitution results in $$\delta p = \left(\frac{\partial f}{\partial p}\right)^{-1}_{g_0,p_0}(g_p^{+1}(dc) - \hat{g}_p^{+1}) \quad (16)$$

where $g_o$ is the incoming variable corresponding to $x_o$ is the one-dimensional map of FIG. 4(b). An example of a code index function dc superimposed on the return map of FIG. 9 is shown in FIG. 10.

It will of course be appreciated by those skilled in the art that the invention is very general in nature and is not intended to be limited to any of the above-described and currently preferred embodiments. Numerous variations will undoubtedly occur to those skilled in the art and it is intended that the invention encompass all such variations, limited only by the appended claims.

What is claimed is:

1. Apparatus for encoding information in a chaotic oscillation, wherein small variations in a control parameter of an oscillator causes changes in the oscillation without changing the chaotic behaviour of the oscillation and wherein iteration of variables of the oscillation forms an attractor, comprising:

means for generating a map of phase space trajectories of the variables of the oscillation along a section of the attractor;

means for designating windows along said section and assigning symbols to said windows; and means for varying said control parameter of said oscillation to cause said trajectories to pass through selected ones of said windows.

2. Apparatus as claimed in claim 1, wherein said oscillation is a Lorenz oscillator in which the three Lorenz phase variables are represented by x, y and z voltage signals generated by the oscillator.

3. Apparatus as claimed in claim 2, wherein said map generating means comprises a comparator circuit for generating a Poincare Surface-of-Section.

4. Apparatus as claimed in claim 3, wherein said control parameter varying means comprises an analog to digital converter, and digital computer means for generating a correction to the control parameter based on an input code sequence.

5. Apparatus as claimed in claim 1, wherein said map generating means comprises a threshold detector and an analog-to-digital converter for registering data representing intersections of said trajectories with said section.

6. Apparatus as claimed in claim 5, further comprising digital computer means for calculated target data for one of said variables and wherein said control parameter varying means comprises means for comparing said target data with said data generated by said map generating means.

7. Apparatus as claimed in claim 5, wherein a Poincare Surface-of-Section of the attractor generated by the Chua's circuit includes binary symbol windows.

8. Apparatus as claimed in claim 1, comprising:

a threshold logic circuit for causing an analog-to-digital converter to sample an x variable output by the oscillator based on a level of y(t) which corresponds to a surface of section through the attractor.

9. Apparatus as claimed in claim 8, further comprising a second A/D converter, computer means for generating a target trajectory based on input digitized trajectory data; and wherein said control parameter varying means comprises means for generating a control signal by comparing a difference between the sampled X variable and a desired X variable.

10. Apparatus as claimed in claim 9, wherein said difference means is a look-up table with (high byte, low byte)=(x bits, x target).

11. Apparatus as claimed in claim 9, wherein difference determining means comprises a subtract and multiply circuit in a digital-to-analog converter.

12. Apparatus as claimed in claim 1, wherein said oscillation is generated by a Chua's circuit.

13. Apparatus as claimed in claim 1, wherein said control parameter varying means is an amplifier having an output proportional to a gain of the amplifier.

14. A method for encoding information in a chaotic oscillation, small variations in a control parameter of the oscillation causing changes in divergence of the oscillation about at least one focus without changing the chaotic behavior of the oscillation such that iteration of variables of the oscillation form an attractor, comprising the steps of:

(a) generating a map of sampled phase space trajectories of the variables of the oscillation along a section of the attractor;

(b) designating windows along said section and assigning symbols to said windows; and (c) varying said control parameter of said oscillator to cause said trajectories to pass through selected ones of said windows.

15. A method as claimed in claim 14, wherein step (c) comprises the steps of generating a Poincare Surface-of-Section, iterating a value of a variable along the Poincare Surface-of-Section to plot a predicted trajectory, and varying the control parameter to cause the sampled trajectory to equal the predicted trajectory.

* * * * *